(12) United States Patent
Lee et al.

(10) Patent No.: US 11,796,403 B2
(45) Date of Patent: Oct. 24, 2023

(54) HIGH-SENSITIVITY SENSOR HAVING CRACK-CONTAINING TRANSPARENT CONDUCTIVE THIN FILM AND METHOD FOR PREPARING SAME

(71) Applicant: SEOUL NATIONAL UNIVERSITY R&DB FOUNDATION, Seoul (KR)

(72) Inventors: Taemin Lee, Gyeonggi-do (KR); Yong Whan Choi, Seoul (KR); Gunhee Lee, Seoul (KR); Man Soo Choi, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 1343 days.

(21) Appl. No.: 16/305,179

(22) PCT Filed: May 24, 2017

(86) PCT No.: PCT/KR2017/005401
§ 371 (c)(1),
(2) Date: Nov. 28, 2018

(87) PCT Pub. No.: WO2017/209435
PCT Pub. Date: Dec. 7, 2017

(65) Prior Publication Data
US 2020/0240860 A1 Jul. 30, 2020

(30) Foreign Application Priority Data
May 30, 2016 (KR) .................. 10-2016-0066677

(51) Int. Cl.
*G01L 1/00* (2006.01)
*G01L 1/22* (2006.01)
(Continued)

(52) U.S. Cl.
CPC .......... *G01L 1/2287* (2013.01); *C23C 14/086* (2013.01); *C23C 14/34* (2013.01); *H01B 3/441* (2013.01); *H01B 5/14* (2013.01)

(58) Field of Classification Search
CPC ..... G01L 1/2287; C23C 14/086; C23C 14/34; H01B 3/441; H01B 5/14
See application file for complete search history.

(56) References Cited

U.S. PATENT DOCUMENTS 9,349,976 B2  5/2016  Kim et al.
9,841,331 B2  12/2017  Wood et al.
(Continued)

FOREIGN PATENT DOCUMENTS

CN  103411712 A  11/2013
CN  205050572 U  2/2016
(Continued)

OTHER PUBLICATIONS

Kang et al., Ultrasensitive mechanical crack-based sensor inspired by the spider sensory system, Dec. 10, 2014.*
(Continued)

*Primary Examiner* — Max H Noori
(74) *Attorney, Agent, or Firm* — CHRISTENSEN FONDER DARDI; Andrew H. Auderieth; Peter S. Dardi (57) ABSTRACT

Provided is a highly sensitive sensor comprising a cracked transparent conductive thin film. The highly sensitive sensor relates to a sensor which is acquired by means of forming a fine crack in a transparent conductive thin film formed on a substrate and is for measuring external tension and pressure by means of measuring the change of electrical resistance due to changes, shorting or opening in a fine interconnection structure formed by the fine crack. Such highly sensitive transparent conductive crack sensor can be applied to high-precision measurement or an artificial skin, can also be
(Continued)

utilized as a positioning detecting sensor by means of pixelating the sensor, and can be utilized in fields of precise measurements, biometric devices used on the human skin and the like, human motion measurement sensors, display panel sensors and the like.

19 Claims, 12 Drawing Sheets (51) Int. Cl.
*C23C 14/08* (2006.01)
*C23C 14/34* (2006.01)
*H01B 3/44* (2006.01)
*H01B 5/14* (2006.01)

(56) References Cited

U.S. PATENT DOCUMENTS

| | | | |
|---|---|---|---|
| 9,927,311 B2 | 3/2018 | Kang et al. | |
| 10,048,141 B2 | 8/2018 | Iwase et al. | |
| 11,552,057 B2 * | 1/2023 | Chae | H01L 33/08 |
| 2009/0152664 A1 * | 6/2009 | Klem | H01L 31/036 |
| | | | 257/466 |
| 2012/0229882 A1 * | 9/2012 | Fish, Jr. | B60R 1/088 |
| | | | 359/267 |
| 2013/0133435 A1 * | 5/2013 | Muramatsu | G01B 7/18 |
| | | | 73/799 |
| 2016/0123820 A1 * | 5/2016 | Kang | H05K 1/167 |
| | | | 324/693 |
| 2018/0246165 A1 * | 8/2018 | Kim | H01L 22/20 |
| 2020/0240859 A1 * | 7/2020 | Choi | A61B 5/02438 |

FOREIGN PATENT DOCUMENTS

| | | |
|---|---|---|
| CN | 105552113 A | 5/2016 |
| CN | 105609642 A | 5/2016 |
| CN | 105612588 A | 5/2016 |
| CN | 106030267 A | 10/2016 |
| KR | 10-2014-0011444 A | 1/2014 |
| KR | 10-2014-0078704 A | 6/2014 |
| KR | 10-2015-0064707 A | 6/2015 |

OTHER PUBLICATIONS

Park et al., "Ultrasensitive Sensors Inspired the Nature, Polymer Science and Technology", vol. 26, No. 4, Aug. 2015, pp. 301-304.
Kim et al., "A Study on the Resistance and Crack Propagation of ITO/PET Sheet with 20 nm Thick ITO Film", Journal of the Korean Ceramic Society, vol. 46, No. 1, Jan. 2009, pp. 86-93. (English Abstract).
Office Action from corresponding Chinese Application No. 201780032925.6 dated Jul. 20, 2020.
Office Action from corresponding Chinese Application No. 201780032925.6. dated Mar. 2, 2020.

* cited by examiner

HIGH-SENSITIVITY SENSOR HAVING CRACK-CONTAINING TRANSPARENT CONDUCTIVE THIN FILM AND METHOD FOR PREPARING SAME

CROSS REFERENCE TO RELATED APPLICATIONS

This application is a National Stage filing of PCT Application No. PCT/KR2017/005401, filed May 24, 2017, entitled "HIGH-SENSITIVITY SENSOR HAVING CRACK-CONTAINING TRANSPARENT CONDUCTIVE THIN FILM AND METHOD FOR PREPARING SAME," which claims the benefit of priority to Korean Patent Application No. 10-2016-0066677, filed on May 30, 2016, the entire disclosures of both are incorporated herein by reference.

TECHNICAL FIELD

The present invention relates to a highly sensitive sensor comprising a cracked transparent conductive thin film and a process for preparing the same, and it relates to a highly sensitive sensor that can be applied to measurement for highly precisely sensing tension and pressure or an artificial skin by using a transparent conductive thin film with a fine crack.

BACKGROUND ART

In general, a highly sensitive sensor is a device that senses a minute signal and transmits it as data such as an electrical signal, and it is one of the essential parts in the modern industry.

Among such sensors, capacitive sensors, piezoelectric sensors, and strain gauges are known as sensors for measuring pressure or tensile force.

A strain gauge sensor, which is a conventional tension sensor, is a sensor that detects minute mechanical change as electrical signal. If it is adhered to the surface of a machine or a structure, it is possible to measure minute change in dimensions, i.e., strain, occurring on the surface thereof, and a stress that is important for confirming strength or safety can be known from the size of the strain.

Further, the strain gauge measures the deformation of the surface of an object according to the change of the resistance value of a metal resistor. Generally, the resistance value of a metal material increases as it is stretched and decreases as it is compressed by the force from the outside. Accordingly, it is applied as a sensing element of a sensor for converting physical quantities such as force, pressure, acceleration, displacement and torque into electric signal, and also widely used as not only for experiments and researches but also for measurement control.

In recent, researches on the application of a sensor such as an artificial skin to the human body are actively underway. At this time, as a required characteristic of a sensor, it is required to have flexibility to be applied to the curvy human body and a transparency so that there is no objection to application to the human body.

However, conventional strain gauge sensors are vulnerable to corrosion due to the use of metal wires, and not only are they very sensitive, but also needs additional circuits for compensating for small signal due to their low output. Further, a semiconductor tension sensor has a heat sensitive disadvantage. The above sensors also have a limit of opacity due to the materials used.

Due to the above problems, there is a problem that the accuracy of the measured value is lowered because the sensor can be driven only in a specific environment or is influenced by various environmental factors, and at the same time, there is a problem that it is difficult to secure a constant measurement value in the repeated driving. In particular, when considering the characteristics required for an artificial skin, which is under active research in recent years, these sensors are difficult to manufacture a flexible structure due to their structural problems, and their application range is limited due to their opacity.

Accordingly, there is a need for the development of a novel highly sensitive sensor that can overcome the problems.

DISCLOSURE

Technical Problem

In order to solve the above problems in the art, an object of the present invention is to provide a transparent highly sensitive sensor that can detect the change in tension and pressure, which can be applied to various fields because it maintains the accuracy of measurement value even with repeated use while receiving little influence from the environment and has flexibility and transparency.

Further, another object of the present invention is to provide a process for preparing the transparent highly sensitive sensor.

Technical Solution

In order to achieve one object, the present invention provides a transparent highly sensitive sensor, which comprises:
  a transparent substrate; and
  a transparent conductive thin film formed on at least one side of the substrate,
  wherein the transparent conductive thin film comprises a crack with crack faces facing each other and at least some of the faces contacting each other,
  wherein the sensor measures the external stimulus by measuring the electrical change caused by the change of contact area or short or re-contact as the crack faces move according to the external physical stimulus.

In order to achieve another object, the present invention provides a process for preparing the transparent highly sensitive sensor, which comprises the following steps of:
  forming a transparent conductive thin film on at least one side of the substrate; and
  inducing a crack on the conductive thin film.

Advantageous Effects

The transparent highly sensitive sensor of the present invention is capable of measuring tension and/or pressure with high sensitivity by using a transparent conductive thin film, in which a crack is formed, on one side of a substrate, and also has flexibility and transparency. Therefore, it can be applicable to various fields. Such transparent highly sensitive sensor can be applied to highly precise measurement or an artificial skin, and also can be used as a positioning detecting sensor by pixelating the sensor. Accordingly, it can be used in the fields such as precision measurements, biomedical devices through the human body skin and the like, sensors for measuring human motion, display panel sensor and the like.

Further, the highly sensitive sensor is very economical because it can be mass-produced through a simple process.

BEST MODE CARRYING OUT THE INVENTION

Various changes in form and details may be made to the presently disclosed embodiment and thus should not be construed as being limited to the aspects set forth herein. The presently disclosed embodiment is not limited to the aspects described in the present description, and thus it should be understood that the presently disclosed embodiment includes every kind of variation example or alternative equivalent included in the spirit and scope of the presently disclosed embodiment. Also, while describing the aspects, detailed descriptions about related well-known functions or configurations that may diminish the clarity of the points of the aspects of the presently disclosed embodiment will be omitted.

Hereinafter, the highly sensitive sensor comprising a cracked transparent conductive thin film according to embodiments of the present invention will be described in more detail.

The transparent highly sensitive sensor according to one embodiment of the present invention is characterized by a transparent highly sensitive sensor, which comprises: a substrate; and a transparent conductive thin film formed on at least one side of the substrate, wherein the transparent conductive thin film comprises a crack with crack faces facing each other and at least some of the faces contacting each other, wherein the sensor measures the external stimulus by measuring the electrical change caused by the change of contact area or short or re-contact as the crack faces move according to the external physical stimulus.

The transparent highly sensitive sensor is a sensor that measures external tension or pressure by measuring the resistance change of a transparent conductive thin film as a crack formed in the transparent conductive thin film is opened according to tension or pressure.

In the present invention, Young's modulus is also known as 'modulus of elasticity' and is a coefficient that shows the relationship between stress and strain of an elastic material, which is constant regardless of the magnitude of stress in the case of a linear elastic material according to the law of hook.

In the case that a material having larger Young's modulus is placed on a material having smaller Young's modulus, when the material is stretched, a crack is formed in the material having larger Young's modulus due to difference in Young's modulus. The difference in Young's modulus may be about 95 GPa or higher or 100 GPa or higher, and preferably, it may be 111 GPa or higher, 120 GPa or lower, 115 GPa or lower, or 113 GPa or lower. In the present invention, by using the above principle, a transparent conductive thin film having larger Young's modulus is formed on a substrate having smaller Young's modulus, a fine interconnection structure is artificially made and used as a sensor to detect very small change of tension or pressure. Namely, among the cracks formed in the transparent conductive thin film, there is a crack with crack faces facing each other and at least some of the faces contacting each other. When external stimulus such as tension or pressure change is applied thereto, due to the change of contact area as the contacted crack faces moves, electric resistance is changed, or due to electrical short or opening, there is big change of resistance value on the conductive thin film. As a result, by detecting the change, the transparent conductive thin film structure can be utilized as a tension sensor, a pressure sensor and the like.

According to one embodiment, the crack present in the transparent conductive thin film may have various shapes, and the degree of cracking may vary depending on thickness of the transparent conductive thin film, the forming conditions and the like, but not particularly limited thereto.

In the transparent highly sensitive sensor of the present invention, the substrate may preferably be any one selected from the group consisting of polyethylene terephthalate (PET), polypropylene (PP) and polyethylene (PE), or a combination thereof, and the most preferably, it may be polyethylene terephthalate (PET).

According to one embodiment, preferably, transmittance of the substrate may be 85% or higher, thickness of the substrate may be 30 μm to 100 μm, and Young's modulus may be 3 GPa to 5 GPa.

In the transparent highly sensitive sensor of the present invention, the transparent conductive thin film may preferably be any one selected from the group consisting of ZnO, ZnO:B, ZnO:Al, ZnO:H, SnO, $SnO_2$, $SnO_2$:F, Indium-Tin-Oxide (ITO) and fluorinated SnO (FTO), or a combination thereof, and the most preferably, it may be Indium-Tin-Oxide (ITO).

According to one embodiment, thickness of the transparent conductive thin film is not limited, but it is preferable that the film has such thickness that a crack can be formed by a mechanical method such as tension (stretching) or bending. The condition of the crack formation may vary depending on the types of the transparent conductive thin film and the substrate.

In the transparent highly sensitive sensor of the present invention, thickness of the transparent conductive thin film may preferably be 0.1 nm to 1 μm, more preferably, 100 nm to 1000 nm, and more preferably 450 nm to 600 nm. Further, Young's modulus of the transparent conductive thin film may be 100 GPa to 120 GPa.

According to one embodiment, preferably, the crack may be formed in the direction perpendicular to the tension direction. The reason is that the crack formed in the direction perpendicular to the tension direction can maximize the effect of the resistance change on the tension.

In the transparent highly sensitive sensor of the present invention, gauge factor of the transparent highly sensitive sensor may be 1 to $1\times10^5$, and preferably, it may be 4,000 to 5,000.

In the present invention, the gauge factor refers to the rate of resistance change of a strain gauge to the strain generated.

In the transparent highly sensitive sensor of the present invention, it is confirmed that the transparent highly sensitive sensor operates at a radius from 1 mm to 5 mm in a flexibility test. Further, the sensor may have transmittance of 80% or higher, preferably 85% or higher.

Figure 2:
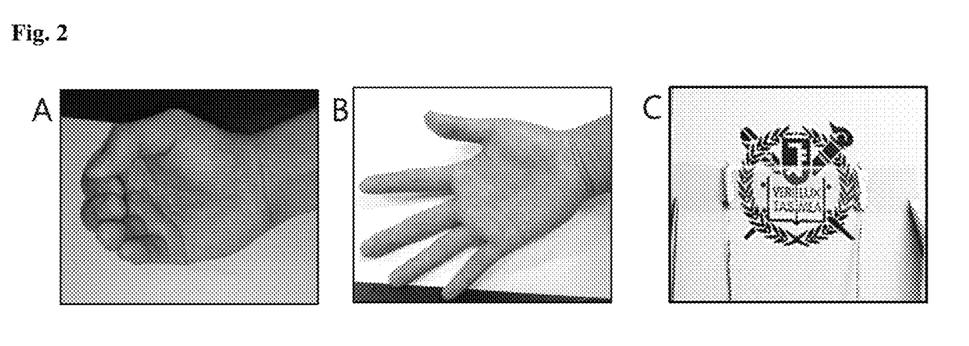
FIG. 2 is a picture showing a highly sensitive sensor which comprises a cracked transparent conductive thin film.

For example, FIG. 2 shows the transparent highly sensitive sensor of the present invention. As can be seen from FIG. 2, the transparent highly sensitive sensor of the present invention is flexible enough not to be discomforted even when it is attached to the palm of the hand and the palm is closed and opened, and it has transparency so that the text on the back is clearly shown through.

According to the above characteristics, the transparent highly sensitive sensor of the present invention can be applied to various fields such as an artificial skin and a display panel, and also can be used as a positioning detecting sensor by pixelating the sensor.

MODE FOR INVENTION

Hereinafter, the present invention is explained by the following examples in more detail. The following examples are intended to further illustrate the present invention. Accordingly, those of ordinary skill in the art will recognize that various changes and modifications of the embodiments described herein can be made without departing from the scope and spirit of the invention.

Example 1: Manufacture of Transparent Highly Sensitive Sensor 600 nm thick Indium-Tin-Oxide (ITO) was deposited by a sputtering process on a 30 μm thick PET film (Young's modulus: 3 GPa). The deposition conditions were 200 W, 45 mins and no heating.

Figure 1:
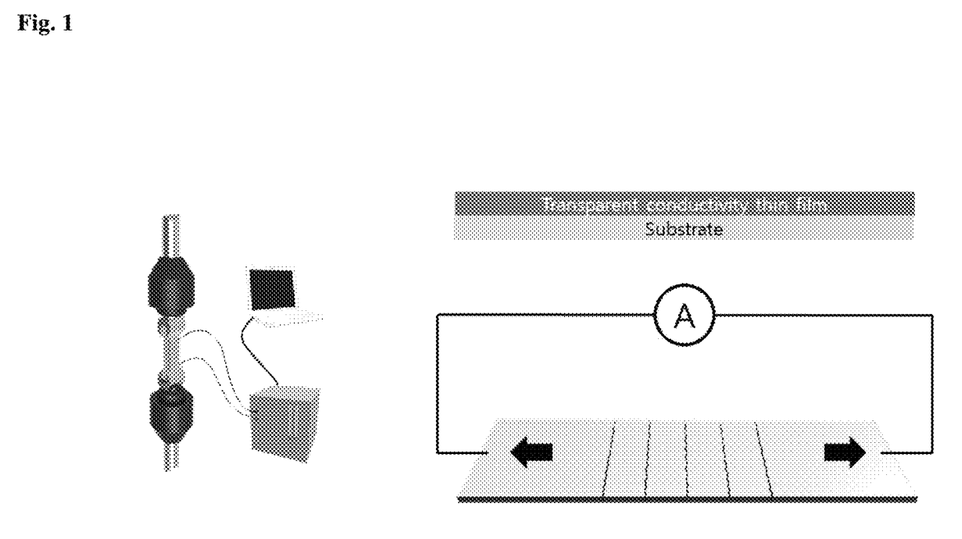
FIG. 1 is a schematic diagram illustrating the principle of operation of a sensor which comprises a cracked transparent conductive thin film.
Figure 3:
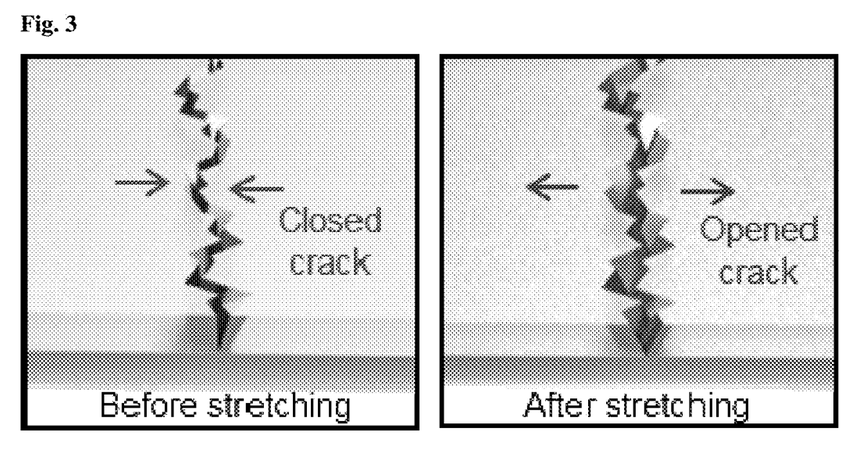
FIG. 3 is a mimetic diagram showing that the interconnection structure of a crack is opened when external stimulus is applied to a highly sensitive sensor comprising a cracked transparent conductive thin film.

At this time, the ITO was left in an amorphous state (Young's modulus of the amorphous ITO: 116 GPa). The reason is that when the ITO was crystallized, it can be easily shorted and therefore it cannot act as a sensor. Then, tension was applied to the manufactured sensor to artificially create a crack. At this time, the crack was formed in the direction perpendicular to the tension (stretching) direction. Then, wires were attached to the sensor using a conductive polymer so that electrical signal could be connected to the sensor. The transparent highly sensitive sensor thus manufactured was illustrated in FIG. 1 and FIG. 2. FIG. 3 shows that the crack is opened as the transparent highly sensitive sensor operates.

<Test Example 1> FESEM Analysis of Crack

After stretching the sensor of Example 1 by 2%, the FESEM image of the crack part was analyzed.

Figure 4:
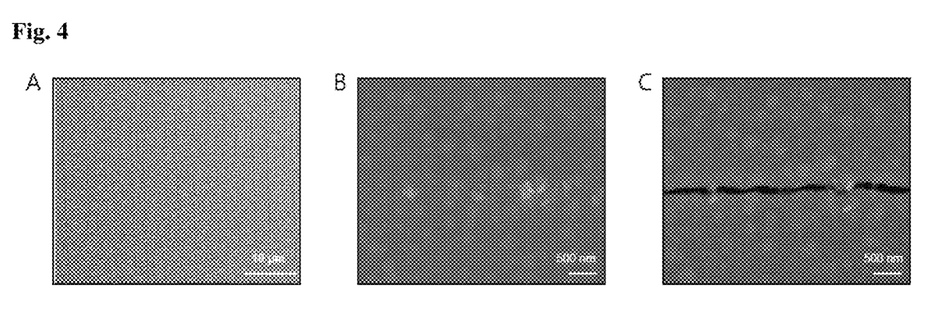
FIG. 4 is a FESEM image which is observed after stretching a highly sensitive sensor comprising a cracked transparent conductive thin film by 2%.

The results of the analysis were shown in FIG. 4. As shown in FIG. 4, it was confirmed that the crack was formed in the direction perpendicular to the tension direction.

<Test Example 2> Comparison of Transmittance Before and after Crack Formation

Transmittances of the sensor of Example 1 before and after crack formation were compared. The transmittance was measured by UV visible spectroscopy.

Figure 5:
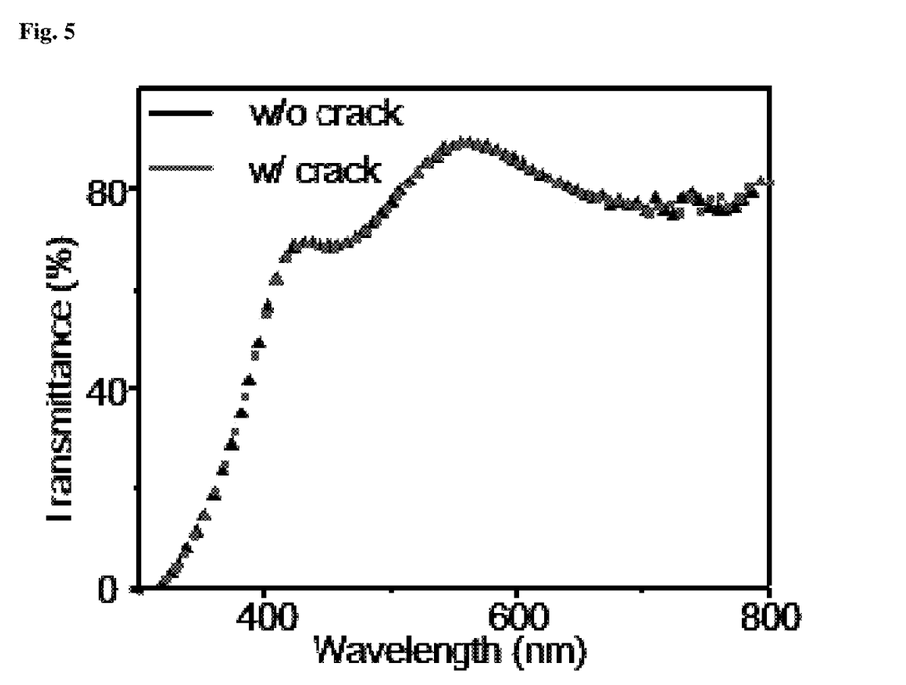
FIG. 5 is a graph showing transmittance of a highly sensitive sensor comprising a cracked transparent conductive thin film before and after crack formation.

The results of the analysis were shown in FIG. 5. As shown in FIG. 5, it was confirmed that there was almost no change in transmittance before and after crack formation.

<Test Example 3> Change of Resistance Value According to Strain Change

Figure 6:
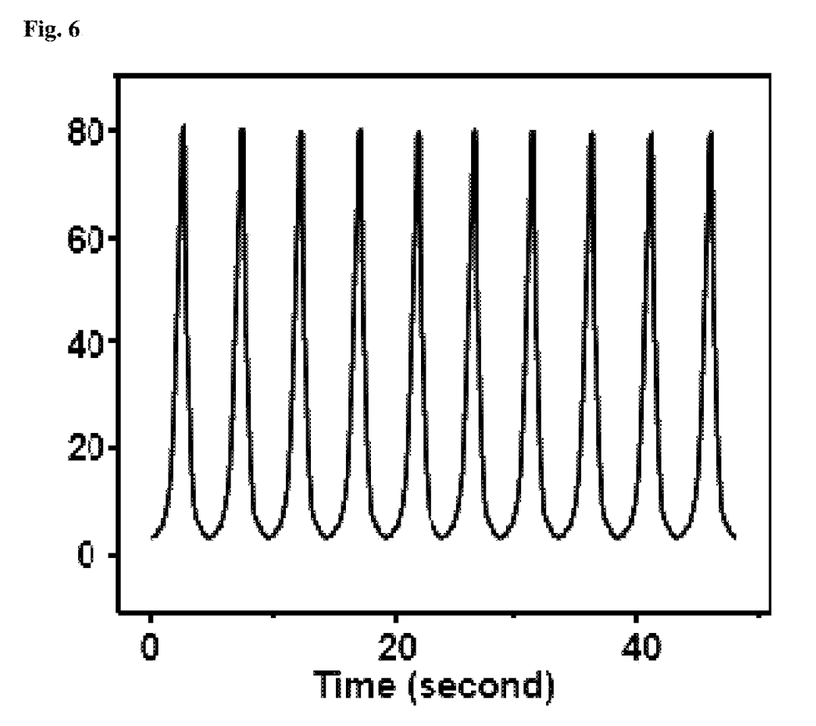
FIG. 6 is a graph showing electrical resistance change of a highly sensitive sensor comprising a cracked transparent conductive thin film over time (ITO thickness: 600 nm, 2% stretching, gauge factor: 4000).
Figure 7:
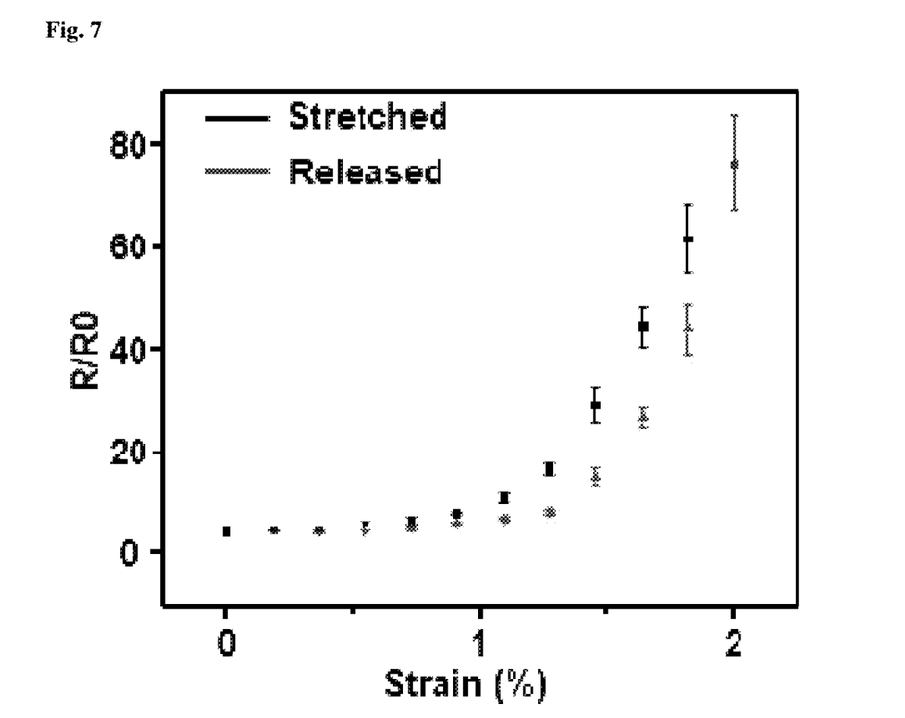
FIG. 7 is a graph showing electrical resistance change of a highly sensitive sensor comprising a cracked transparent conductive thin film with strain change, which shows hysteresis and reproducibility of the sensor (Red: stretching, Black: releasing).

Change in resistance was measured by applying a current while applying tension to the sensor of Example 1. Specifically, FIG. 6 shows electrical resistance change measured while stretching up to 2% and then returning to the original state, i.e., 0% strain. FIG. 7 is a graph showing hysteresis and reproducibility of the sensor of Example 1.

As shown in FIG. 6, it was confirmed that when measuring electrical resistance while stretching the sensor of Example 1 up to 2% and then returning to the original state, i.e., 0% strain, the electrical resistance was changed to about 80 times of the initial resistance, and the same type of resistance change could be repeatedly and reproducibly obtained. This is due to the fact that the crack faces that were in contact with each other moves as the strain is applied, the contact area becomes small, and eventually the electrical resistance increases sharply. Further, as the strain is removed, the sensor shrinks and the separated crack faces come into contact, and as the contact area increases, the resistance decreases and then returns to its original state.

FIG. 7 shows the change of resistance while stretching (loading) the sensor of Example 1, which is about 80 times or higher than the initial resistance at 2%, and shows a reversible change that returns to the original resistance value while removing (unloading) the strain. It can be found that the sensitivity of the sensor, defined as resistance change/initial resistance/strain, is GF: 4,000 or more at 2% strain.

<Test Example 4> Change of Resistance Value According to Pressure Change

Change in resistance according to change in pressure was measured while applying pressure to the sensor of Example 1.

Figure 8:
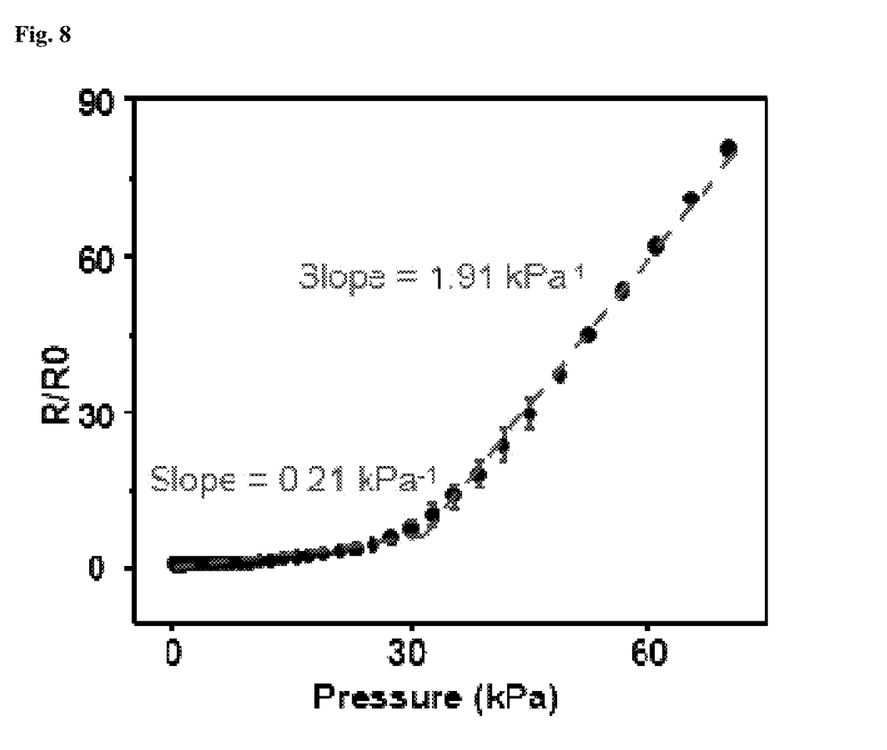
FIG. 8 is a graph showing electrical resistance change of a highly sensitive sensor comprising a cracked transparent conductive thin film with pressure change.
Figure 9:
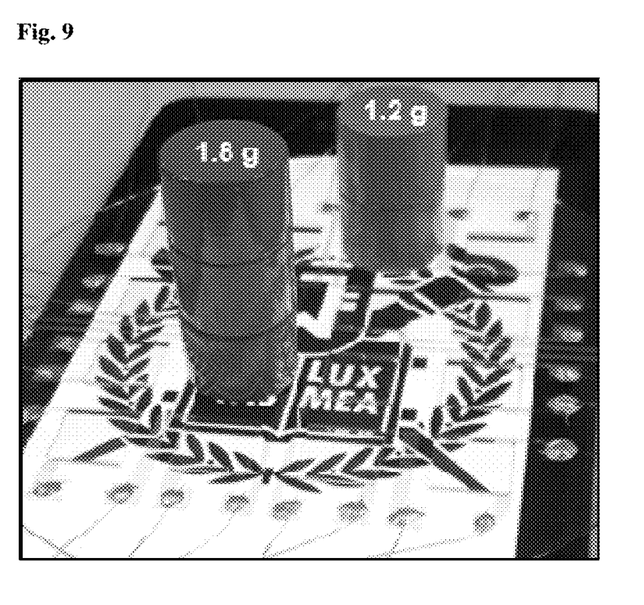
FIG. 9 shows pressure sensor pixels of a highly sensitive sensor comprising a cracked transparent conductive thin film.
Figure 10:
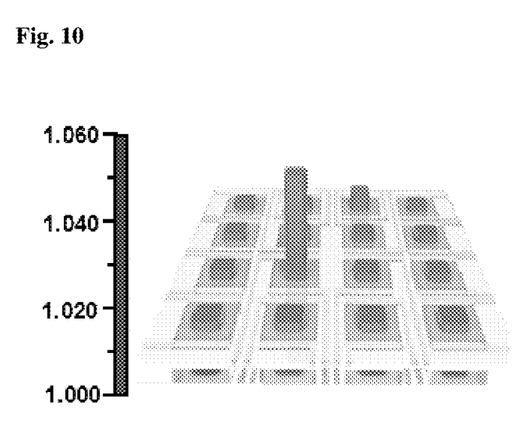
FIG. 10 is a drawing showing pressure sensor pixels observing resistance change on the part where a red bar pressed pixels.
Figure 11:
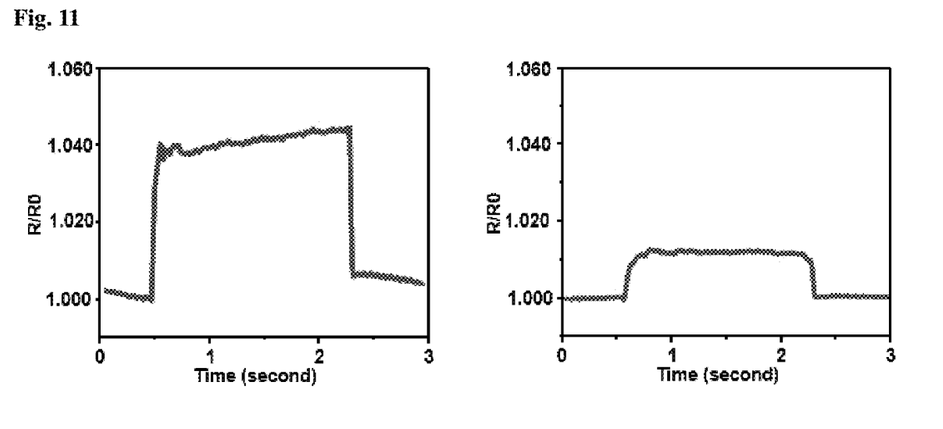
FIG. 11 is a graph showing electrical resistance change of the pressure sensor pixel of FIG. 10 (Left: when applying pressure of 1.8 kPa, Right: when applying pressure of 1.2 kPa).

FIG. 8 shows the change of the resistance value measured at the sensor of Example 1 while changing pressure from 0 kPa to 70 kPa. It can be found that the resistance value changes up to 80 times when the pressure is 70 kPa. FIG. 9 shows pixels of the pressure sensor, and FIG. 10 and FIG. 11 show that the resistance of the part pressed by a stick is changed. Specifically, FIG. 11 (종기방) shows the results when applying pressure of 1.8 kPa (left) and pressure of 1.2 kPa (right) to the sensor of Example 1.

Test Example 5

Figure 12:
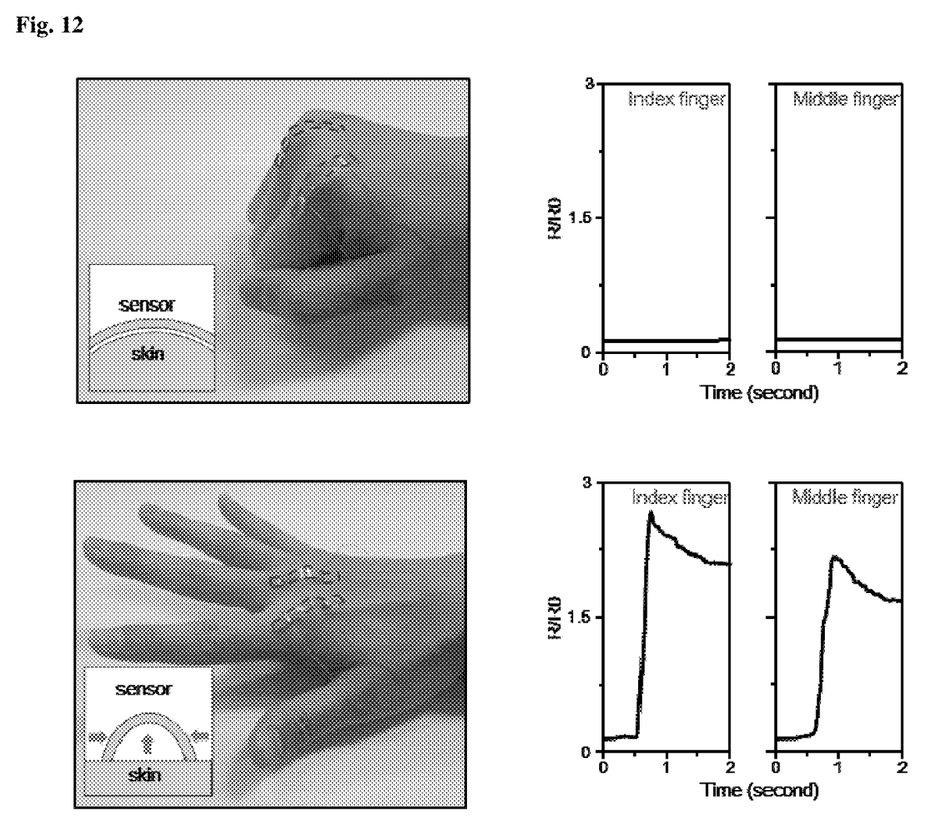
FIG. 12 shows the results of testing flexibility of the sensor according to the present invention.

As shown in FIG. 12, transparent electrode sensors were connected to the joints of index and middle fingers, respectively, and finger motion recognition was conducted. Hand gripping state was set to the initial state, and at this time, the transparent electrode sensor is bent at a radius of 3 mm. When opening the hand, the transparent electrode sensor is bent more to a radius of 5 mm. At this time, a crack of the transparent electrode on top of the transparent electrode sensor is opened, and therefore resistance is changed. Through the above-mentioned experiment, it was confirmed that the transparent electrode sensor can recognize finger motion, and can be used at a radius of 5 mm.

Although specific embodiments of the present invention are described in detail as described above, it will be apparent to those skilled in the art that the specific description is merely desirable exemplary embodiment and should not be construed as limiting the scope of the present invention. Therefore, the substantial scope of the present invention is defined by the accompanying claims and equivalent thereof.

The invention claimed is:

1. A transparent highly sensitive sensor, which comprises:
   a transparent substrate; and
   a transparent conductive thin film formed on at least one side of the substrate,
   wherein the transparent conductive thin film is in an amorphous state and has a thickness in the range of 450 nm to 1 μm,
   wherein the transparent conductive thin film comprises a crack with crack faces facing each other and at least some of the faces contacting each other,
   wherein the sensor measures an external stimulus by measuring an electrical change caused by a change of contact area or short or re-contact as the crack faces move according to the external stimulus.

2. The transparent highly sensitive sensor according to claim 1, wherein Young's modulus of the substrate is lower than Young's modulus of the transparent conductive thin film.

3. The transparent highly sensitive sensor according to claim 2, wherein the substrate is any one selected from the group consisting of polyethylene terephthalate (PET), polypropylene (PP) and polyethylene (PE), or a combination thereof.

4. The transparent highly sensitive sensor according to claim 1, wherein the transparent conductive thin film is any one selected from the group consisting of ZnO, ZnO:B, ZnO:Al, ZnO:H, SnO, $SnO_2$, $SnO_2$:F, ITO and fluorinated SnO (FTO), or a combination thereof.

5. The transparent highly sensitive sensor according to claim 1, wherein the crack is formed by difference in Young's modulus between the substrate and the transparent conductive thin film.

6. The transparent highly sensitive sensor according to claim 5, wherein the crack is a nano-level fine crack.

7. The transparent highly sensitive sensor according to claim 1, wherein electrical resistance value of the conductive thin film is changed due to electrical short or opening of the crack caused by the external stimulus.

8. The transparent highly sensitive sensor according to claim 7, wherein the external stimulus is any one of tension and pressure, or a combination thereof.

9. The transparent highly sensitive sensor according to claim 1 wherein the substrate has a Young's modulus from about 3 GPa to about 5 GPa and the transparent conductive thin film has a Young's modulus from about 100 GPa to about 120 GPa.

10. The transparent highly sensitive sensor according to claim 1, wherein gauge factor of the transparent highly sensitive sensor is 1 to $1 \times 10^5$.

11. The transparent highly sensitive sensor according to claim 1, wherein the highly sensitive sensor has flexibility of 1 mm radius or more and transmittance of 80% or higher.

12. A pressure sensor comprising the transparent highly sensitive sensor according to claim 1.

13. A tension sensor comprising the transparent highly sensitive sensor according to claim 1.

14. An artificial skin comprising the transparent highly sensitive sensor according to claim 1.

15. A transparent display panel comprising the transparent highly sensitive sensor according to claim 1.

16. A process for preparing the transparent highly sensitive sensor of claim 1, which comprises the following steps of:
   forming a transparent conductive thin film on at least one side of the substrate; and
   inducing a crack on the conductive thin film.

17. The process according to claim 16 wherein Young's modulus of the substrate is lower than Young's modulus of the transparent conductive thin film by about 95 GPa to about 120 GPa.

18. The process according to claim 16 wherein inducing a crack is performed by stretching or bending.

19. The process according to claim 16 further comprising pixelating the transparent highly sensitive sensor to form a transparent position detecting sensor.

* * * * *